United States Patent
Smith et al.

(10) Patent No.: US 7,592,045 B2
(45) Date of Patent: Sep. 22, 2009

(54) SEEDING OF HTC FILLERS TO FORM DENDRITIC STRUCTURES

(75) Inventors: James D. B. Smith, Monroeville, PA (US); Gary Stevens, Surrey (GB); John W. Wood, Winter Springs, FL (US)

(73) Assignee: Siemens Energy, Inc., Orlando, FL (US)

(*) Notice: Subject to any disclaimer, the term of this patent is extended or adjusted under 35 U.S.C. 154(b) by 410 days.

(21) Appl. No.: 11/397,000

(22) Filed: Apr. 3, 2006

(65) Prior Publication Data

US 2006/0280873 A1 Dec. 14, 2006

Related U.S. Application Data

(63) Continuation-in-part of application No. 11/152,983, filed on Jun. 14, 2005.

(60) Provisional application No. 60/580,023, filed on Jun. 15, 2004.

(51) Int. Cl.
*B05D 5/00* (2006.01)
(52) U.S. Cl. .................................... 427/385.5
(58) Field of Classification Search ............... 427/385.5
See application file for complete search history.

(56) References Cited

U.S. PATENT DOCUMENTS

| | | | |
|---|---|---|---|
| 3,246,271 A | 4/1966 | Ford | |
| 3,866,316 A | 2/1975 | Takechi et al. | |
| 3,974,302 A | 8/1976 | Croop et al. | |
| 4,001,616 A | 1/1977 | Lonseth et al. | |
| 4,160,926 A | 7/1979 | Cope et al. | |
| 4,335,367 A | 6/1982 | Mitsui et al. | |
| 4,361,661 A | 11/1982 | Jackson | |
| 4,400,226 A | 8/1983 | Horrigan | |
| 4,427,740 A | 1/1984 | Stackhouse et al. | |
| 4,634,911 A | 1/1987 | Studniarz et al. | |
| 4,694,064 A | 9/1987 | Tomalia et al. | |
| 4,704,322 A | 11/1987 | Roberts | |
| 4,760,296 A | 7/1988 | Johnston et al. | |
| 4,806,806 A | 2/1989 | Hjortsberg et al. | |

(Continued)

FOREIGN PATENT DOCUMENTS

EP 0 157 936 A1 10/1985

(Continued)

OTHER PUBLICATIONS

Tomoyuki Matsumura, "Phase Structures and Thermal and Conductive properties of Epoxy-Alumina Hybrids Filled with Conductive Fillers," STN database No. 2002:257918, Apr. 8, 2007.

(Continued)

*Primary Examiner*—Erma Cameron

(57) ABSTRACT

In one embodiment the present invention provides for a method of forming HTC dendritic fillers 40 within a host resin matrix that comprises adding HTC seeds 42 to the host resin matrix. The HTC seeds have been surface functionalized to not substantially react with one another. The seeds then accumulate HTC building blocks 42, and the HTC building blocks have also been surface functionalized to not substantially react with one another. Then assembling the HTC building blocks with the HTC seeds to produce HTC dendritic fillers 40 within the host resin matrix.

23 Claims, 4 Drawing Sheets

U.S. PATENT DOCUMENTS

| | | |
|---|---|---|
| 5,011,872 A | 4/1991 | Latham et al. |
| 5,037,876 A | 8/1991 | Birkle et al. |
| 5,126,192 A | 6/1992 | Chellis et al. |
| 5,281,388 A | 1/1994 | Palmer et al. |
| 5,466,431 A | 11/1995 | Dorfman et al. |
| 5,510,174 A | 4/1996 | Litman |
| 5,540,969 A | 7/1996 | Schuler |
| 5,578,901 A | 11/1996 | Blanchet-Fincher et al. |
| 5,723,920 A | 3/1998 | Markovitz et al. |
| 5,780,119 A | 7/1998 | Dearnaley et al. |
| 5,801,334 A | 9/1998 | Theodorides |
| 5,878,620 A | 3/1999 | Gilbert et al. |
| 5,904,984 A | 5/1999 | Smith et al. |
| 5,938,934 A | 8/1999 | Balogh et al. |
| 5,982,056 A | 11/1999 | Koyama et al. |
| 6,015,597 A | 1/2000 | David |
| 6,048,919 A | 4/2000 | McCullough |
| 6,103,382 A | 8/2000 | Smith et al. |
| 6,130,495 A | 10/2000 | Schulten et al. |
| 6,130,496 A | 10/2000 | Takigawa et al. |
| 6,140,590 A | 10/2000 | Baumann et al. |
| 6,160,042 A | 12/2000 | Ishida |
| 6,190,775 B1 | 2/2001 | Smith et al. |
| 6,238,790 B1 | 5/2001 | Smith et al. |
| 6,255,738 B1 | 7/2001 | Distefano et al. |
| 6,261,424 B1 | 7/2001 | Goncharenko et al. |
| 6,261,481 B1 | 7/2001 | Akatsuka et al. |
| 6,265,068 B1 | 7/2001 | David et al. |
| 6,288,341 B1 | 9/2001 | Tsunoda et al. |
| 6,344,271 B1 | 2/2002 | Yadav et al. |
| 6,359,232 B1 | 3/2002 | Markovitz et al. |
| 6,393,642 B1 | 5/2002 | Pollman et al. |
| 6,396,864 B1 | 5/2002 | O'Brien et al. |
| 6,432,537 B1 | 8/2002 | Devlin et al. |
| 6,504,102 B2 | 1/2003 | Tsunoda et al. |
| 6,506,331 B2 | 1/2003 | Meguriya |
| 6,509,063 B1 | 1/2003 | McCarthy et al. |
| 6,548,172 B2 | 4/2003 | David et al. |
| 6,572,937 B2 | 6/2003 | Hakovirta et al. |
| 6,632,561 B1 | 10/2003 | Bauer et al. |
| 6,635,720 B1 | 10/2003 | Tomalia et al. |
| 6,746,758 B2 | 6/2004 | Tsunoda et al. |
| 6,821,672 B2 | 11/2004 | Zguris |
| 6,882,094 B2 | 4/2005 | Dimitrijevic et al. |
| 6,905,655 B2 | 6/2005 | Gabriel et al. |
| 6,974,627 B2 | 12/2005 | Morita et al. |
| 7,033,670 B2 | 4/2006 | Smith |
| 7,042,346 B2 | 5/2006 | Paulsen |
| 7,120,993 B2 | 10/2006 | Yamamoto et al. |
| 7,180,409 B2 | 2/2007 | Brey |
| 7,189,778 B2 | 3/2007 | Tobita et al. |
| 7,425,366 B2 | 9/2008 | Okamoto et al. |
| 2002/0058140 A1 | 5/2002 | Dana et al. |
| 2002/0070621 A1 | 6/2002 | Mori et al. |
| 2002/0098285 A1 | 7/2002 | Hakovirta et al. |
| 2003/0035960 A1 | 2/2003 | Tsunoda et al. |
| 2003/0040563 A1 | 2/2003 | Sagal et al. |
| 2004/0094325 A1 | 5/2004 | Yoshida et al. |
| 2004/0152829 A1 | 8/2004 | Tobita et al. |
| 2004/0241439 A1 | 12/2004 | Morita et al. |
| 2005/0097726 A1 | 5/2005 | Yamamoto et al. |
| 2005/0116336 A1 | 6/2005 | Chopra et al. |
| 2005/0161210 A1 | 7/2005 | Zhong et al. |
| 2005/0208301 A1 | 9/2005 | Okamoto et al. |
| 2005/0236606 A1 | 10/2005 | Toas et al. |
| 2005/0245644 A1* | 11/2005 | Smith et al. ............... 523/400 |
| 2005/0274450 A1 | 12/2005 | Smith et al. |
| 2005/0274540 A1 | 12/2005 | Smith et al. |
| 2005/0274774 A1 | 12/2005 | Smith et al. |
| 2005/0277349 A1 | 12/2005 | Smith et al. |
| 2005/0277350 A1 | 12/2005 | Smith et al. |
| 2005/0277351 A1 | 12/2005 | Smith et al. |
| 2005/0277721 A1 | 12/2005 | Smith et al. |
| 2006/0034787 A1 | 2/2006 | Bujard |
| 2006/0142471 A1 | 6/2006 | Shindo |
| 2006/0231201 A1 | 10/2006 | Smith et al. |
| 2006/0234027 A1 | 10/2006 | Huusken |
| 2006/0234576 A1 | 10/2006 | Smith et al. |
| 2006/0258791 A1 | 11/2006 | Okamoto et al. |
| 2006/0280873 A1 | 12/2006 | Smith et al. |
| 2006/0281380 A1 | 12/2006 | Smith et al. |
| 2006/0281833 A1 | 12/2006 | Smith et al. |
| 2007/0026221 A1 | 2/2007 | Stevens et al. |
| 2007/0114704 A1 | 5/2007 | Stevens et al. |
| 2007/0141324 A1 | 6/2007 | Stevens et al. |
| 2008/0050580 A1 | 2/2008 | Stevens et al. |
| 2008/0066942 A1 | 3/2008 | Miller |
| 2008/0262128 A1 | 10/2008 | Stevens et al. |

FOREIGN PATENT DOCUMENTS

| | | |
|---|---|---|
| EP | 0 266 602 A1 | 5/1988 |
| EP | 0 394 767 A2 | 10/1990 |
| EP | 0 604 804 A2 | 7/1994 |
| EP | 1 220 240 A1 | 7/2002 |
| EP | 1 300 439 A1 | 4/2003 |
| EP | 1 383 226 A1 | 1/2004 |
| EP | 1 384 567 A1 | 1/2004 |
| EP | 1 486 997 A1 | 12/2004 |
| EP | 1 530 223 A1 | 5/2005 |
| GB | 881036 A2 | 11/1961 |
| JP | 56029305 | 3/1981 |
| JP | 03205443 A | 9/1991 |
| JP | 06313267 A | 11/1994 |
| JP | 10-088201 | 4/1998 |
| JP | 10-211659 | 8/1998 |
| JP | 2002212422 A | 7/2002 |
| JP | 200506389 A | 1/2005 |
| JP | 2005-199562 A | 7/2005 |
| WO | WO 95/02504 A1 | 1/1995 |
| WO | WO 96/28073 A1 | 9/1996 |
| WO | WO 98/41993 A1 | 9/1998 |
| WO | WO 99/26286 A1 | 5/1999 |
| WO | WO 00/56127 A1 | 9/2000 |
| WO | WO 01/68749 A1 | 9/2001 |
| WO | WO 01/84659 A1 | 11/2001 |
| WO | WO 03/040445 A1 | 5/2003 |
| WO | WO 2004/006271 A1 | 1/2004 |
| WO | WO 2004/052999 A2 | 6/2004 |
| WO | WO 2004/067606 A1 | 8/2004 |
| WO | WO 2005/069312 | 7/2005 |
| WO | WO 2005/106089 A2 | 11/2005 |
| WO | WO 2005/123825 A1 | 12/2005 |
| WO | WO 2005/124790 A2 | 12/2005 |
| WO | WO 2006/002014 A1 | 1/2006 |
| WO | WO 2006/007385 A1 | 1/2006 |

OTHER PUBLICATIONS

Yasufumi Shibata, "Lipophilic Inorgantic-Organic Hybrid Materials with Low Frictional Coefficient," STN database No. 2002:568167, Jul. 3, 2002, pp. 1-3.

Tari et al., "Impacts on Turbine Generator Design by the Application of Increased Thermal Conducting Stator Insulation" Cigre SC11-01 Meeting, Paper No. 132 (2002).

Sun et al., "Fundamental Research on Surface Modification of Nano-sized Silica for Underfill Applications" 2004 Electronic Components and Technology Conference (2004).

Brutsch et al., "New High Voltage Insulation with Increased Thermal Conductivity" Electrical Electronics Insulation Conference 1993 Proceedings, (Oct. 1993).

Tari et al., "A High Voltage System with Increased Thermal Conductivity for Turbo Generators" Coil Winding, Insulation and Electrical Manufacturing Conference (2001).

Derwent Acc-No. 1980-39239C (JP 55053802 A Derwent Abstract) (Nippon Mica Seisaku).

Product Data Sheet for Polar Therm Boron Nitride Powder Grades PT120, PT140, PT160, and PT 180, provided by Momentive Performance Materials (2007).

* cited by examiner

US 7,592,045 B2

SEEDING OF HTC FILLERS TO FORM DENDRITIC STRUCTURES

CROSS-REFERENCE TO RELATED APPLICATIONS

This invention is a Continuation in Part of U.S. application Ser. No. 11/152,983 "HTC Materials Incorporated into Resins," filed Jun. 14, 2005, by Smith, et al., which is incorporated herein by reference, and which claims the benefit of U.S. Provisional Application No. 60/580,023, filed Jun. 15, 2004.

FIELD OF THE INVENTION

The field of the invention relates to the forming of dendritic structures in a resin matrix.

BACKGROUND

With the use of any form of electrical appliance, there is a need to electrically insulate conductors. With the push to continuously reduce the size and to streamline all electrical and electronic systems there is a corresponding need to find better and more compact insulators and insulation systems.

Various epoxy resin materials have been used extensively in electrical insulation systems due to their practical benefit of being tough and flexible electrical insulation materials that can be easily adhered to surfaces. Traditional electrical insulation materials, such as mica flake and glass fiber, can be surface coated and bonded with these epoxy resins, to produce composite materials with increased mechanical strength, chemical resistance and electrical insulating properties. In many cases epoxy resins have replaced traditional varnishes despite such materials having continued use in some high voltage electrical equipment.

Good electrical insulators, by their very nature, also tend to be good thermal insulators, which is undesirable. Thermal insulating behavior, particularly for air-cooled electrical equipment and components, reduces the efficiency and durability of the components as well as the equipment as a whole. It is desirable to produce electrical insulation systems having maximum electrical insulation and minimal thermal insulation characteristics.

Electrical insulation often appears in the form of insulating tapes, which themselves have various layers. Common to these types of tapes is a paper layer that is bonded at an interface to a fiber layer, both layers tending to be impregnated with a resin. A favored type of insulation material is a mica-tape. Improvements to mica tapes include catalyzed mica tapes as taught in U.S. Pat. No. 6,103,882. The mica-tape may be wound around conductors to provide extremely good electrical insulation. An example of this is shown in FIG. 1. Illustrated here is a coil 13, comprising a plurality of turns of conductors 14, which in the example illustrated here are assembled into a bakelized coil. The turn insulation 15 is prepared from a fibrous material, for example glass or glass and Dacron which is heat treated. Ground insulation for the coil is provided by wrapping one or more layers of composite mica tape 16 about the bakelized coil 14. Such composite tape may be a paper or felt of small mica flakes combined with a pliable backing sheet 18 of, for example, glass fiber cloth or polyethylene terephthalate mat or film, the layer of mica 20 being bonded thereto by a liquid resinous binder. Generally, a plurality of layers of the composite tape 16 are wrapped about the coil depending upon voltage requirements. A wrapping of an outer tape 21 of a tough fibrous material, for example, glass fiber, may be applied to the coil.

Generally, multiple layers of the mica tape 16 are wrapped about the coil with sixteen or more layers generally being used for high voltage coils. Resins are then impregnated into the tape layers. Resins can even be used as insulation independently from the insulating tape. Unfortunately this amount of insulation only further adds to the complications of dissipating heat. What is needed is electrical insulation that can conduct heat higher than that of conventional methods, but that does not compromise the electrical insulation and other performance factors including mechanical and thermal capability.

Other difficulties with the prior art also exist, some of which will be apparent upon further reading.

SUMMARY OF THE INVENTION

High Thermal Conductivity (HTC) organic-inorganic hybrid materials may be formed from discrete two-phase organic-inorganic composites, from organic-inorganic continuous phase materials based on molecular alloys and from discrete organic-dendrimer composites in which the organic-inorganic interface is non-discrete within the dendrimer core-shell structure. Continuous phase material structures may be formed which enhance phonon transport and reduce phonon scattering by ensuring the length scales of the structural elements are shorter than or commensurate with the phonon distribution responsible for thermal transport, and/or that the number of phonon scattering centers are reduced such as by enhancing the overall structural order of the matrix, and/or by the effective elimination or reduction of interface phonon scattering within the composite.

Continuous organic-inorganic hybrids may be formed by incorporating inorganic, organic or organic-inorganic hybrid nano-particles in linear or cross-linked polymers (including thermoplastics) and thermosetting resins in which nano-particles dimensions are of the order of or less than the polymer or network segmental length (typically 1 to 50 nm or greater). These various types of nano-particles will contain reactive surfaces to form intimate covalently bonded hybrid organic-inorganic homogeneous materials. Similar requirements exist for inorganic-organic dendrimers which may be reacted together or with matrix polymers or reactive resins to form a continuous material. In the case of both discrete and non-discrete organic-inorganic hybrids it is possible to use sol-gel chemistry to form a continuous molecular alloy. The resulting materials will exhibit higher thermal conductivity than conventional electrically insulating materials and may be used as bonding resins in conventional mica-glass tape constructions, when utilized as unreacted vacuum-pressure impregnation resins and as stand alone materials to fulfill electrical insulation applications in rotating and static electrical power plant and in both high (approximately over 5 kV) and low voltage (approximately under 5 kV) electrical equipment, components and products.

The formation of engineered electrical insulation materials having prescribed physical properties and performance characteristics, and based on the use of nano-to-micro sized inorganic fillers in the presence of organic host materials, requires the production of particle surfaces which can form an intimate interface with the organic host. This may be achieved through the grafting of chemical groups onto the surface of the fillers to make the surface chemically and physically compatible with the host matrix, or the surfaces may contain chemically reactive functional groups that react with the organic host to form covalent bonds between the particle and the host. The use of nano-to-micro sized inorganic fillers in the presence of organic host materials requires the production of particles with defined surface chemistry in addition to bulk dielectric and electrical properties and thermal conductivity. Most inorganic materials do not allow independent selection of structural characteristics such as shape and size and properties to suit different electrical insulation applications or to achieve composites having the right balance of properties and performance. This may be achieved by selecting particles with appropriate bulk properties and shape and size characteristics and then modifying the surface and interfacial properties and other characteristics to achieve the additional control of composite properties and performance required for electrical insulation applications. This may be achieved by appropriate surface coating of the particles which may include the production of metallic and non-metallic inorganic oxides, nitrides, carbides and mixed systems and organic coatings including reactive surface groups capable of reacting with appropriate organic matrices which act as the host material in the electrical insulation system. The resulting hybrid materials and composites in unreacted or partially reacted form may be used as bonding resins in mica-glass tape constructions, as unreacted vacuum-pressure impregnation resins for conventional mica tape constructions, in other glass fiber, carbon fiber and ply-type and textile composites and as stand alone materials to fulfill electrical insulation applications in rotating and static electrical power plant and in both high and low voltage electrical equipment, components and products.

To improve the transport of phonons through a high thermal conductivity (HTC) impregnated medium requires a reduction in the mean distances between the HTC materials to below that of the mean phonon path length, or a medium in which the phonon mean free path is large. This reduces the phonon scattering and produces a greater net flow or flux of phonons away from the heat source. If the resin material is less viscous then it may be impregnated into a host matrix medium, such as a multi-layered insulating tape.

HTC dendritic structures make good thermal conductors due to the inherent closeness of neighboring and adjoining HTC particles and their overall degree of ordering. These structures can be hundreds and thousands of particles long and be branched, with many interconnections between other dendritic structures within the same resin which altogether forms a percolation network. To form the dendritic fillers, surface functionalized HTC materials react with one another, or the fillers self assemble as a result of inter-particle forces. The more branched a dendritic structure the better interconnectivity of the particle phase in the filled resin. Therefore having a plurality of connecting particle structures and particle-particle interaction leads to filled resins with greater thermal conductivity.

The dendritic structures are formed within the resin by HTC seeds that pick up HTC building blocks. More seeds bind to already picked up building blocks and the dendritic structure grows thusly. The HTC seeds and building blocks are the HTC materials described herein and these are bound to each other both physically and by the presence of surface functionalized groups. As will be discussed, the two can be combined by a variety of techniques depending on the application of the resin.

These and other objects, features, and advantages in accordance with the present invention are provided particular embodiments by a method for forming HTC dendritic fillers within a host resin matrix that comprises adding HTC seeds to the host resin matrix. The HTC seeds have been surface functionalized to not substantially react with one another. The seeds then accumulate HTC building blocks, and the HTC building blocks have also been surface functionalized to not substantially react with one another. Then assembling the HTC building blocks with the HTC seeds to produce HTC dendritic fillers within the host resin matrix.

In particular embodiments the HTC building blocks react with the HTC seeds, meaning that surface functionalized groups between the two species react with one another. In other embodiments the HTC building blocks interact with the HTC seeds, meaning that there is physical particle-particle interaction.

In other embodiments the HTC building blocks are accumulated by impregnating the host resin with the added HTC seeds into a porous media, and the porous media contains the HTC building blocks. The porous media may be a composite tape, and the porous media may be a natural organic or inorganic polymer fiber matrixes, or a fabric.

In still other embodiments the HTC building blocks are accumulated by mixing the HTC building blocks into the host resin matrix. In related embodiments reacting of the HTC building blocks with the HTC seeds progresses after accumulation as a slow chemical reaction. Also reacting the HTC building blocks progresses with the HTC seeds after addition of an accelerant like zinc naphthenate, chromium acetylacetonate, tribenzyltin chloride, tribenzyltin acetate, and/or tetrabutyltitanate.

In still other related embodiments the HTC seeds have been surface functionalized to have an average of more than one surface functional group. Alternately, the HTC building blocks have been surface functionalized to have an average of more than one surface functional group. The HTC seeds can be selected from the group consisting of silicon oxides, boron nitride, aluminum oxide, magnesium oxide, aluminum nitride, silicon nitride, and the HTC building blocks can be selected from the group consisting of boron nitride, aluminum oxide, and silicon oxide.

In other related embodiments, a percentage of the HTC seeds are grafted to the host resin matrix, and the HTC seeds may be grafted to the host resin matrix prior to the accumulation of the HTC building blocks. The HTC dendritic fillers is 5-40% by volume of the host resin matrix, and the ratio of HTC seeds to HTC building blocks comprising the HTC dendritic fillers is in the range of approximately 2:1 to 1:4 by volume.

In another embodiment, the present invention provides for a method of forming HTC dendritic structures within a resin impregnated porous media that comprises obtaining a host resin and adding HTC seeds to the host resin. The HTC seeds do not substantially react with one another, and a percentage of the HTC seeds are grafted to the host resin. This percentage can vary, but should be at least 5%. Then inserting HTC building blocks to a porous media, where the HTC building blocks do not substantially react with one another. The method also comprises impregnating the host resin into the porous media, where the host resin picks up HTC building blocks from the host media, and reacting and interacting the HTC building blocks with the HTC seeds to produce HTC dendritic fillers within the host resin matrix. Then curing the host resin.

In related embodiments substantially all of the HTC seeds are reacted with the HTC building block. The method may also further comprise mixing additional building blocks directly into the host resin. In other particular embodiments substantially all of the HTC seeds are grafted to the host resin, and the porous media is a composite tape.

Other embodiments of the present invention also exist, which will be apparent upon further reading of the detailed description.

BRIEF DESCRIPTION OF THE FIGURES.

The invention is explained in more detail by way of example with reference to the following drawings.

DETAILED DESCRIPTION OF THE INVENTION

Figure 1:
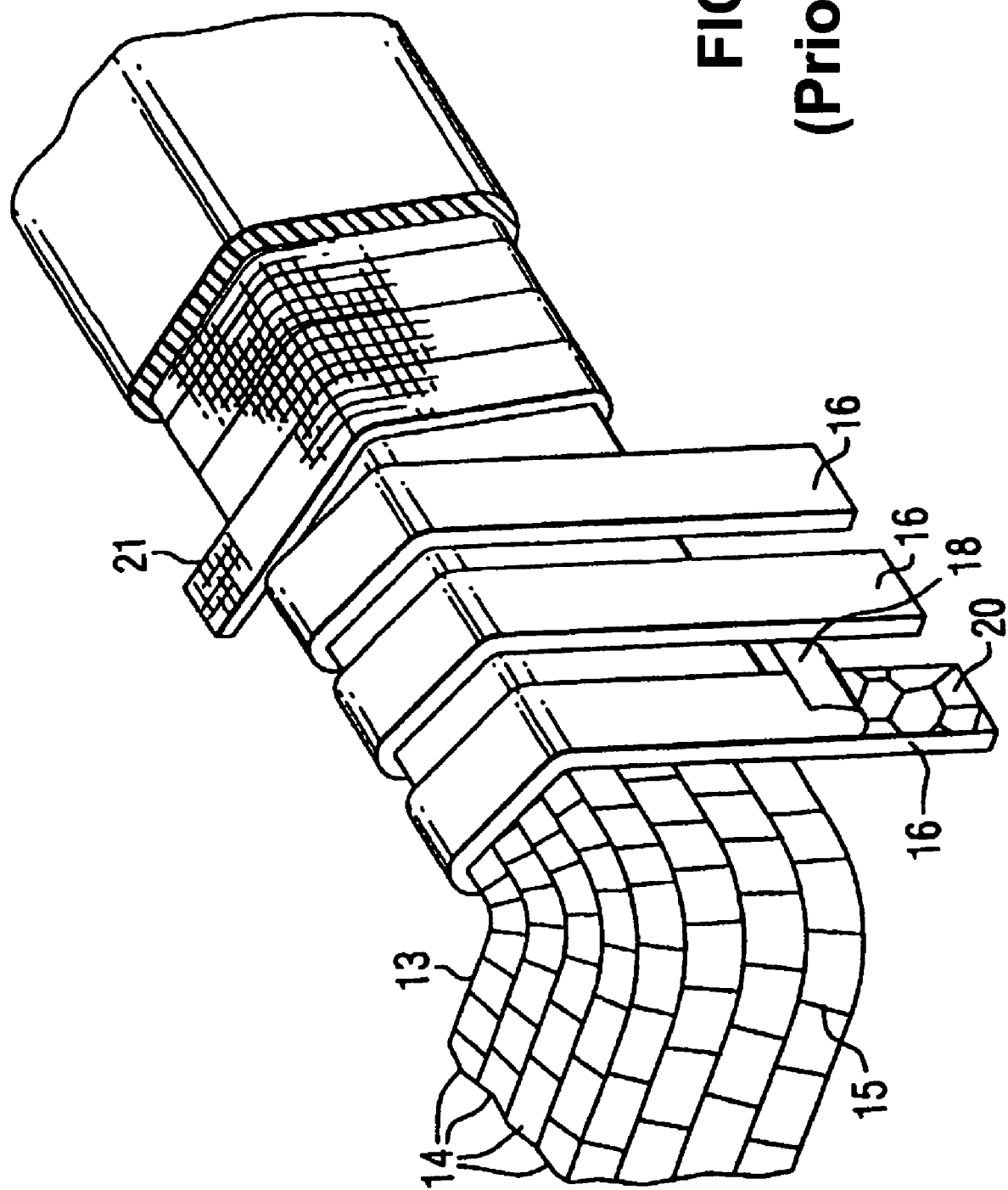
FIG. 1 shows the use of an insulating tape being lapped around a stator coil.

High thermal conductivity (HTC) composites comprise a resinous host network combined with fillers that are two phase organic-inorganic hybrid materials. The organic-inorganic hybrid materials are formed from two phase organic-inorganic composites, from organic-inorganic continuous phase materials that are based on molecular alloys, and from discrete organic-dendrimer composites in which the organic-inorganic interface is non-discrete with the dendrimer core-shell structure. Phonon transport is enhanced and phonon scattering is reduced by ensuring the length scales of the structural elements are shorter than or commensurate with the phonon distribution responsible for thermal transport.

Two phase organic-inorganic hybrids may be formed by incorporating inorganic micro, meso or nano-particles in linear or cross linked polymers (thermoplastics) and thermosetting resins. Host networks include polymers and other types of resins, definitions of which are given below. In general, the resin that acts as a host network may be any resin that is compatible with the particles and, if required, is able to react with the groups introduced at the surface of the filler. Nanoparticle dimensions are typically of the order of or less than the polymer network segmental length. For example 1-30 nm. The inorganic particles contain reactive surfaces to form covalently bonded hybrid organic-inorganic homogeneous materials. The particles may be oxides, nitrides, carbides and hybrid stoichiometric and non-stoichiometric mixes of the oxides, nitrides and carbides, more examples of which are given below.

The inorganic particles are surface treated to introduce a variety of surface functional groups which are capable of participating in reactions with the host network. The surface functional groups include but are not limited to hydroxyl, carboxylic, amine, epoxide, silane and vinyl groups. The groups may be applied using wet chemical methods, non-equilibrium plasma methods, chemical vapor and physical vapor deposition, sputter ion plating and electron and ion beam evaporation methods.

The discrete organic-dendrimer composites may be reacted together or with the resin matrix to form a single material. The surface of the dendrimer can contain reactive groups similar to those mentioned above, which will either allow dendrimer-dendrimer or dendrimer-organic matrix reactions to occur. The dendrimer will have an inorganic core and an organic shell containing the reactive groups of interest. It may also be possible to have an organic core with an inorganic shell which also contains reactive groups such as hydroxyl or silane groupings which can participate in inorganic reactions similar to those involved in common sol-gel chemistries.

In regards to the use of non-discrete organic-inorganic hybrids it is possible to use sol-gel chemistry to form a continuous molecular alloy. Gel sol-chemistries involving aqueous and non-aqueous reactions may be used. Other compounds for the formation of organic-inorganic hybrids include the polyhedral oligomeric silsesquioxanes (POSS), tetraethyl orthosilicate (TEOS) and tetrabutyl orthotitanate (TBOT) and related monomeric and oligomeric hybrid compounds which are organic functionalized inorganic compounds. In the example of POSS, molecules are built around a building block of R—$SiO_{1.5}$ in which the R group is chosen to compatibilize with and/or react with other organic compounds and the host network. The base compounds may be combined to yield larger molecules commensurate with the size of polymer segment and coil structures. POSS may be used to create organic-inorganic hybrids and may be grafted into existing polymers and networks to control properties, including thermal conductivity. The materials may be obtained from suppliers such as Aldrich™ Chemical Co., Hybrid Plastics™ Inc. and Gelest™ Inc.

As mentioned, it is important to control the structural form of the materials to reduce phonon scattering. This can be further assisted by using nano-particles whose matrices are known to exhibit high thermal conductivity and to ensure that the particles size and its interfacial characteristics with the resin are sufficient to sustain this effect, and also to satisfy the length scale requirement to reduce phonon scattering. A choice of structures that are more highly ordered will also benefit this, including reacted dendrimer lattices having both short and longer range periodicity and ladder or ordered network structures that may be formed from a host resin, such as liquid crystal epoxies and polybutadienes.

The filled resins may be used as bonding resins in a variety of industries such as circuit boards and insulating tapes. A particular kind of insulating tape is the mica-glass tape used in the electrical generator fields. Resins with these types of tapes can be used as bonding resins, or as impregnating resins as is known in the art. The filled resin may also be used in the electrical generator field without the tapes to fulfill electrical insulation applications in the rotating and static electrical equipment components.

The tapes may be impregnated with resin before or after being applied to electrical objects. Resin impregnation techniques include VPI and GVPI, discussed more below. In VPI, once a tape is lapped and impregnated it is compressed. Once in position, the resin in the compressed tape is cured, which effectively locks the position of the HTC materials. In some embodiments the resin is cured in a two stage process, as will be apparent to one of ordinary skill in the art. However, optimal compression of the loaded HTC materials favors a completely uncured resin during the compression stage.

Figure 2:
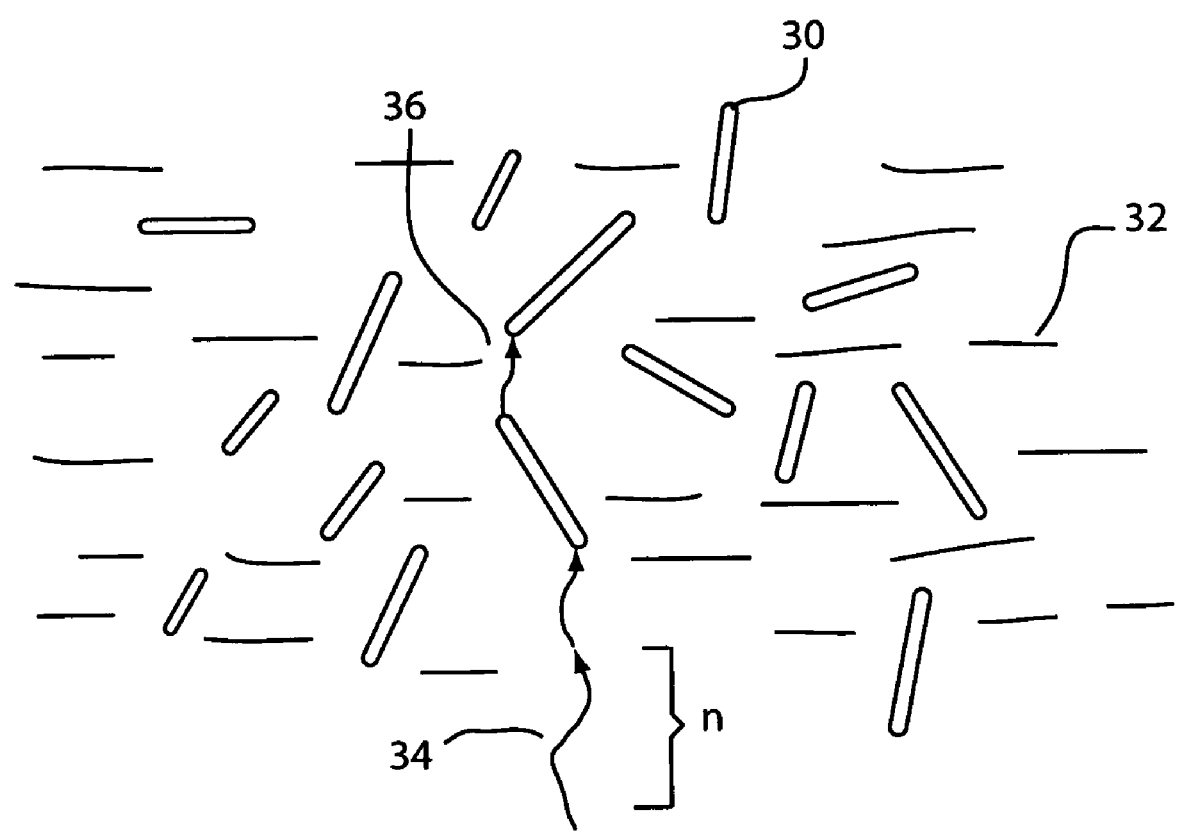
FIG. 2 illustrates phonons traveling through a loaded resin of the present invention.

FIG. 2 shows one embodiment of the present invention. Illustrated here are HTC materials 30 loaded into a resinous matrix 32. Phonons 34 traveling through the matrix have a mean path length n, this is the phonon mean free path. This path length can vary depending on the exact composition of the resin matrix, but is generally from 2 to 100 nm, and more typically 5-50 nm, for resins such as epoxy resins. Therefore the mean distance between the loaded HTC materials should be on average less than this distance. Note that the distance between the HTC materials can vary in the thickness versus transverse direction of the tape, and it is generally the thickness direction where the spacing needs to be optimized.

As phonons 34 travel through the resin 32 they will tend to pass along the embedded HTC materials 30. This will increase the local phonon flux since the raw HTC materials will have a thermal conductivity of between 10-1000 W/mK, as opposed to the resin which is about 0.1-0.5 W/mK. As phonons pass along a loaded HTC material the phonons 36 pass to the next HTC material if the distance between the materials is less than n, therefore the HTC materials form an interconnecting network. FIG. 2 illustrates an idealized path.

In practice there will be phonon scattering as the phonons pass between the resin and HTC materials, although the shorter the distance between the materials, and the better the match of phonon propagation characteristics between the HTC materials and the resin, the less the scattering.

The amount of HTC materials loaded in the resin could actually be quite low, for example about 10% as illustrated in FIG. 2. The average distances, or length scales, between loaded HTC materials therefore may be slightly greater than n, however, a large percentage will still be less than n and therefore fall within embodiments of the present invention. In particular embodiment, the percentage materials that are less than n distance from the next HTC material is over 50%, with particular embodiment being over 75%. In particular embodiment the average length of the HTC materials is greater than n, which further aids in phonon transport.

The shorter n the greater the concentration of loaded HTC materials, and conversely, the greater the particle size, the less HTC materials needed. Particular embodiment use 5-60% loaded HTC materials by total volume of the resins and fillers, with more particular embodiments at 25-40%. When the resin is impregnated into the tape, it will fill up the spaces between the tape fibers and substrates. The HTC distribution within the tape at this point, however, is often not optimized, and can even have the mean distance between HTC materials greater than n. Practice of the present invention then compresses the resin impregnated tapes and reduces the distances between the loaded HTC materials.

When a loaded resin is being impregnated into a tape, the fibers or particles of the tape act to block some of the HTC materials, particularly if the resin is 30% or more filler. However, by compressing the tapes, the reverse happens, and more fillers are trapped within the tape as the HTC materials attach themselves to non-mobile parts of the overall structure. The HTC fillers even get pinned to one another. In the embodiments given, it has been implied that the fillers do not react with the resin matrix, however, in some embodiments the fillers do form covalent bonds with the resin and form more homogeneous matrixes. In a homogenous matrix, the resin molecules that are bound to fillers will be retained better than the unbound resin molecules during compression.

Resins are used in a plurality of industries, and have a large number of uses. Different properties of the resins affect not only their uses, but also the quality and efficiency of the products that they are used with. For example, when resins are used in electrical insulation applications, their characteristics of dielectric strength and voltage endurance needs to be high, as does the thermal stability and thermal endurance. However, often contrary to these objectives, resins usually will also have a low thermal conductivity. The present invention balances the various physical properties of resins and the insulation system they are introduced into to produce a system that has a higher thermal conductivity than conventional electrically insulating materials while maintaining adequate, and even enhancing, key physical properties such as dielectric strength, voltage endurance, thermal stability and thermal endurance, mechanical strength and viscoelastic response. Delamination and microvoid formation resulting from stresses caused by thermal and mechanical cycling effects are reduced or eliminated. As used herein, the term resin refers to all resins and epoxy resins, including modified epoxies, polyesters, polyurethanes, polyimides, polyesterimides, polyetherimides, bismaleimides, silicones, polysiloxanes, polybutadienes, cyanate esters, hydrocarbons etc. as well as homogeneous blends of these resins. This definition of resins includes additives such as cross-linking agents, accelerators and other catalysts and processing aids. Certain resins, such as liquid crystal thermosets (LCT) and 1,2 vinyl polybutadiene combine low molecular weights characteristics with good crosslinking properties. The resins can be of an organic matrix, such as hydrocarbons with and without hetero atoms, an inorganic matrix, containing silicate and/or alumino silicate components, and a mixture of an organic and inorganic matrix. Examples of an organic matrix include polymers or reactive thermosetting resins, which if required can react with the reactive groups introduced on inorganic particle surfaces. Cross-linking agents can also be added to the resins to manipulate the structure and segmental length distribution of the final crosslinked network, which can have a positive effect on thermal conductivity. This thermal conductivity enhancement can also be obtained through modifications by other resin additives, such as catalysts, accelerators and other processing aids. Certain resins, such as liquid crystal thermosets (LCT) and 1,2 vinyl polybutadiene combine low molecular weights characteristics with good crosslinking properties. These types of resins tend to conduct heat better because of enhanced micro and macro ordering of their sub-structure which may lead to enhanced conduction of heat as a result of improved phonon transport. The better the phonon transport, the better the heat transfer.

When the high thermal conductivity fillers of the present invention are mixed with resins they form a continuous product, in that there is no interface between the resins and the fillers. In some cases, covalent bonds are formed between the fillers and the resin. However, continuous is somewhat subjective and depends on the scale to which the observer is using. On the macro-scale the product is continuous, but on the nano-scale there can still be distinct phases between the fillers and the resin network. Therefore, when referring high thermal conductivity fillers mixing with the resin, they form a continuous organic-inorganic composite, on the macro-scale, while on the micro-scale the same mixture can be referred to as a hybrid.

As mentioned, filled resin may be used in the electrical generator field without the tapes to fulfill electrical insulation applications in the rotating and static electrical equipment components. The use of high thermal conductivity materials in a generator is multiple. Within the stator coil there are component materials other than the groundwall which must have high thermal conductivity to optimize the design. Likewise other components associated with the coils to maximize heat removal. Improvements to stator design dictate that improvements be made to rotor design so that generator efficiency can by maximized.

Examples of these places components and materials to which the high thermal conductivity technology described herein can be applied in a stator include inter-strand insulation, internal corona protection (ICP) systems, outer corona protection (OCP) systems, bottom, center, and top fillers including packing and prestressed driving strips (PSDS—top ripple springs); side fillers, laminates, and side PSDS, coil center separator or sword, coil transposition filler, stator wedge, core insulation, diamond spacers, braces or brackets, end-winding bonding resin and compressible gap fillers, connector insulation, parallel ring insulation and parallel ring support structure. In a rotor examples include cell or slot liner, interturn insulation, turn and ground insulation where integral, end cap insulation, blocking, radial pins and leads and slot top packer or "U".

Figure 3:
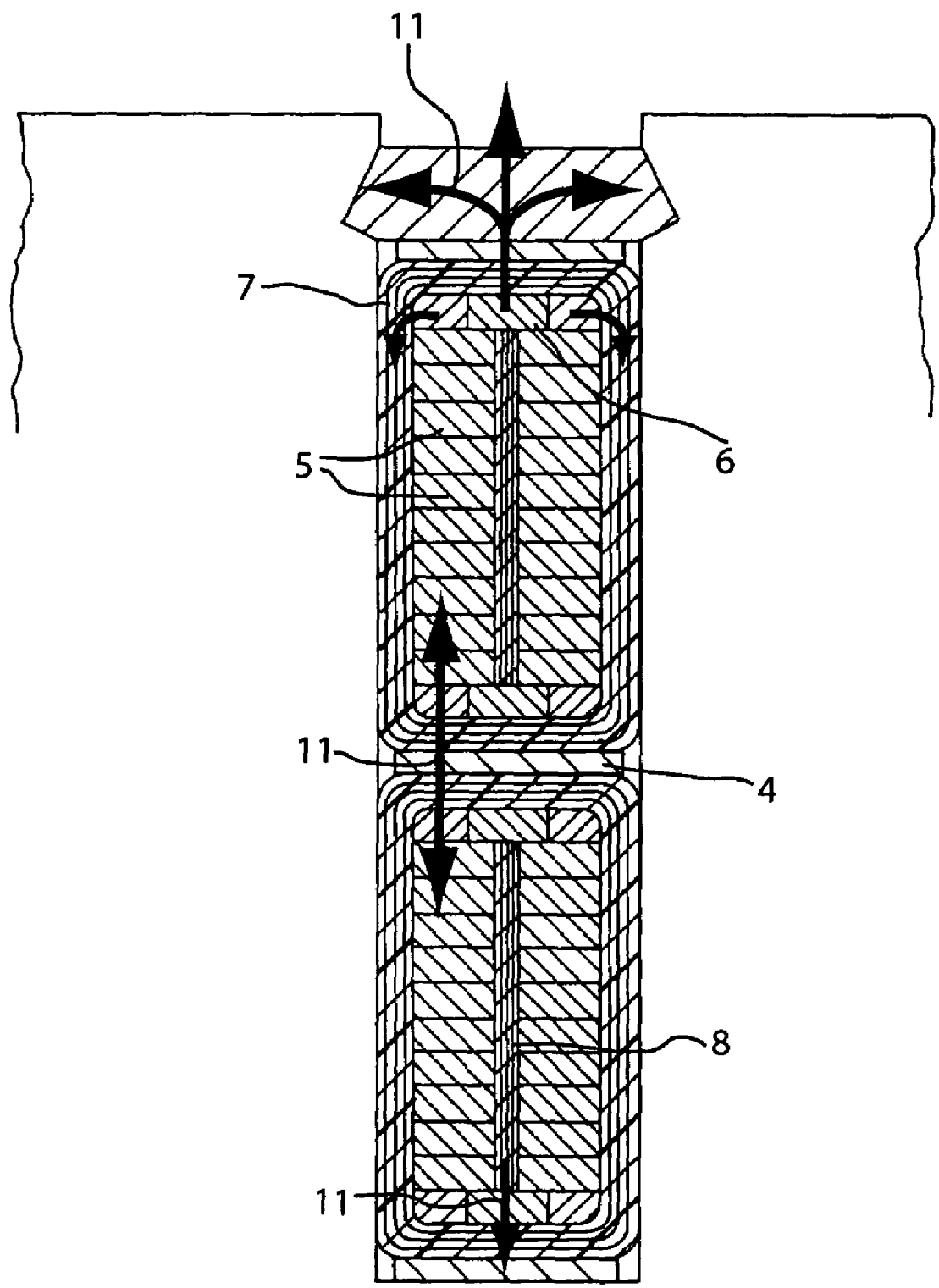
FIG. 3 illustrates heat flow through stator coils.

For clarity, reference is made to FIG. 3, showing a cross sectional view of the heat flow 11 through stator coils. The stator coil depicted by this figures includes copper stands 5, transposed strands 6, bottom, center, and top fillers 4, groundwall insulation 7, and center separator 8, among other parts.

The components or materials described above may be produced by a variety of means, including laminating, extrusion, molding, and other processes with which one experienced in the art will be familiar. The construction materials used in a stator coil are copper and insulation. The copper is in the form of strands which are generally insulated, assembled, and converted into a bakelized coil or stack. The bakelized coil is insulated with groundwall insulation, but there are electrical stress control layers associated with it. The major component affecting the thermal conductivity of the stator coil is the groundwall insulation, but other components benefit from being similarly improved. For example the stress control and other systems employed in the construction of stator coils can typically be of from 10 to 20% of the insulation thickness from copper to stator core. In some instances it is proposed to tune the thermal and electrical conductivities to the desired values by introducing structural changes to the materials.

By way of further example, an internal stress control layer may consist of a low conductivity layer, which may be connected to the copper directly or through resistance, or insulated from it. In such instances an insulating layer may be applied to the bakelized coil surface before the low conductivity layer is applied. An insulating tape or sheet may be applied onto the bakelized coil for the purpose of bonding or for smoothing of the surface to fill in void areas. Then an additional layer or layers of material having the required properties may be applied after the low conductivity layer. This may be for electrical purposes such as stress control or insulation.

After the groundwall is applied a low conductivity layer(s) is applied to the surface of the coil to ensure a good connection to the core, to obviate partial discharge and bar bounce effects while avoiding shorting core laminations. An application in which this low conductivity layer has an insulating layer applied over it has also been described in patent literature. The outer corona protection system may therefore include low conductivity, insulating, and part insulating layers.

To control the electrical stress in the stator end region a stress control layer is applied at the ends of the coil straight portion and into the endwindings or involute region. This normally consists of a silicon carbide loaded tape or paint, applied in one or several layers, sometimes stepped layers. It may also be combined with an insulating layer or a relatively high resistivity layer(s). In this application the high thermal conductivity materials will significantly enhance the thermal conductivity of the system. The choice of when to use a high thermal conductivity material will depend on the machine design and the thermal conductivity properties of the normal insulating material and of the groundwall.

In the end region glass tapes and shrink materials are used in certain types of design, for various functions such as consolidation and to enhance mechanical bracing. In addition the mechanical bracing of the endwinding region involves the use of resins, diamond spacers, conformable impregnateable materials such as felts or cloths, and materials into which resin can be loaded such as bags, bladders or hoses. In these components and materials the use of high thermal conductivity materials will significantly enhance the thermal conductivity of the system. The choice of where and when to use a high thermal conductivity material will depend on the machine design and the thermal conductivity properties of the normal insulating material.

In direct cooled rotors the cooling gas or medium is in direct contact with the copper. There are two main designs for direct cooling—radial cooling and axial cooling. The endwinding region may have a different method of cooling. In the radial cooled design the gas passes along a sub-slot or hollow turn at the bottom of each slot. It then passes radially through cooling slots in the solid copper turns and exhausts at the top of the slot. In the axial cooled design the turns are hollow and usually square or rectangular in cross section. Gas enters at each end through holes in the side walls of the hollow conductors and passes along the inside of the copper tubes, exhausting radially through holes in the copper at the rotor center.

In both these designs of rotor the effects of using high thermal conductivity materials on the design is significant. Indeed it may be more significant in indirectly cooled machines. The rotor coils are insulated from ground typically by molded epoxy glass laminates in the form of either slot cells or angles. Interturn insulation may be laminate or angles. It can be appreciated that such components can be made highly thermally conducting by the use of the methods described herein.

One embodiment of the present invention adds high thermal conductivity (HTC) materials to resins to improve the thermal conductivity of the resins. In some embodiments the other physical properties of the resins are reduced in a trade-off with higher thermal conductivity, but in other embodiments, some of the other physical properties will not be significantly affected, and in some particular embodiments these other properties will be improved. In particular embodiments, the HTC materials are added to resins, such as LCT epoxy, that have ordered sub-structures. When added to these types of resins, the amount of HTC material used can be reduced versus use in resins without ordered sub-structures.

The HTC materials loaded into the resins are of a variety of substances that can be added so that they may physically and/or chemically interact with or react with the resins to improve thermal conductivity. In one embodiment, the HTC materials are dendrimers, and in another embodiment they are nano or micro inorganic fillers having a defined size or shape including high aspect ratio particles with aspect ratios (ratio mean lateral dimension to mean longitudinal dimension) of 3 to 100 or more, with a more particular range of 10-50.

In a related embodiment, the HTC materials may have a defined size and shape distribution. In both cases the concentration and relative concentration of the filler particles is chosen to enable a bulk connecting (or so-called percolation) structure to be achieved which confers high thermal conductivity with and without volume filling to achieve a structurally stable discrete two phase composite with enhanced thermal conductivity. In another related embodiment, the orientation of the HTC materials increases thermal conductivity. In still another embodiment, the surface coating of the HTC materials enhances phonon transport. These embodiments may stand apart from other embodiments, or be integrally related. For example, dendrimers are combined with other types of highly structured materials such as thermoset and thermoplastic materials. They are uniformly distributed through a resin matrix such that the HTC materials reduce phonon scattering and provide micro-scale bridges for phonons to produce good thermally conducting interfaces between the HTC materials. The highly structured materials are aligned so that thermal conductivity is increased along a single direction or directions to produce either localized or bulk anisotropic electrically insulating materials. In another embodiment HTC is achieved by surface coating of lower thermal conductivity fillers with metal oxides, carbides or nitrides and mixed systems having high thermal conductivity which are physically or chemically attached to fillers having defined bulk properties, such attachment being achieved by processes such as chemical vapour deposition and physical vapour deposition and also by plasma treatment.

In related embodiments, the HTC materials form essentially homogenous mixtures with the resins, essentially free of undesired microscopic interfaces, variable particle wetting and micro void formation. These homogeneous materials form a continuous-phase material which are non-discrete at length scales shorter than either the phonon wavelength or phonon mean free path in conventional electrical insulating materials. In some embodiments, intentional interfaces can be placed in the resin structure so as to control dielectric breakdown. In insulating materials, dielectric breakdown will occur given the right conditions. By controlling the nature and spatial distribution of the interfaces in two-phase system, dielectric breakdown strength and long term electrical endurance can be enhanced. Increases in dielectric strength will take place in part because of increased densification, the removal of micro voids and a higher level of internal mechanical compression strength.

Resins of the present invention may be used for impregnation of other composite constructions such as a mica tape and glass and polyester tape. In addition to the standard mica (Muscovite, Phlogopite) that is typically used for electrical insulation there is also Biotite mica as well as several other mica-like Alumino-Silicate materials such as Kaolinite, Halloysite, Montmorillonite and Chlorite. Montmorillonite has lattices in its structure which can be readily intercalated by polymer resins, metal cations and nano particles to give high dielectric strength composites.

In other embodiments, the present invention is used as a continuous coating on surfaces where insulation is desired; note that "continuous coating" is a description of a macroscale application. In a continuous coating, the resin forms a coating on materials without the need for a tape or other substrate. When used with a substrate, the HTC materials can be combined with the resin by a variety of different methods. For example, they can be added prior to the resin being added to the substrate, or the HTC materials can be added to the substrate before the resin is impregnated thereon, or the resin can be added first, followed by the HTC material and then an additional impregnation of resin. Other fabrication and process methods will be apparent to one of ordinary skill in the art.

In one embodiment the present invention uses novel organic-inorganic materials which offer higher thermal conductivity and also maintain or enhance other key properties and performance characteristics. Such materials have applications in other high voltage and low voltage electrical insulation situations where high thermal conductivity confers advantage in terms of enhanced power rating, reduced insulation thickness, more compact electrical designs and high heat transfer. The present invention adds nano, meso, and micro inorganic HTC-materials such as alumina, magnesium oxide, silicon carbide, boron nitride, aluminum nitride, zinc oxide and diamond, as well as others, to give higher thermal conductivity. These materials can have a variety of crystallographic and morphological forms and they may be processed with the matrix materials either directly or via a solvent which acts as a carrier liquid. The solvent mixture may be used to mix the HTC-materials into the matrix to various substrates such as mica-tape. In contrast, molecular hybrid materials which form another embodiment of the present invention, do not contain discrete interfaces, and have the advantages conferred by an inorganic phase within an organic. These materials may also confer enhancement to other physical properties such as thermal stability, tensile strength, flexural strength, and impact strength, variable frequency and temperature dependant mechanical moduli and loss and general viscoelastic response, etc.

In another embodiment, the present invention comprises discrete organic-dendrimer composites in which the organic-inorganic interface is non-discrete with a dendrimer core-shell structure. Dendrimers are a class of three-dimensional nanoscale, core-shell structures that build on a central core. The core may be of an organic or inorganic material. By building on a central core, the dendrimers are formed by a sequential addition of concentric shells. The shells comprise branched molecular groups, and each branched shell is referred to as a generation. Typically, the number of generations used is from 1-10, and the number of molecular groups in the outer shell increase exponentially with the generation. The composition of the molecular groups can be precisely synthesized and the outer groupings may be reactive functional groups. Dendrimers are capable of linking with a resin matrix, as well as with each other. Therefore, they may be added to a resin as an HTC material, or, in other embodiments, may form the matrix themselves without being added to traditional resins.

The molecular groups can be chosen for their ability to react, either with each other or with a resin. However, in other embodiments, the core structure of the dendrimers will be selected for their own ability to aid in thermal conductivity; for example, metal oxides as discussed below.

Generally, the larger the dendrimer, the greater its ability to function as a phonon transport element. However, its ability to permeate the material and its percolation potential can be adversely affected by its size so optimal sizes are sought to achieve the balance of structure and properties required. Like other HTC materials, solvents can be added to the dendrimers so as to aid in their impregnation of a substrate, such as a mica or a glass tape. In many embodiments, dendrimers will be used with a variety of generations with a variety of different molecular groups.

Commercially available organic Dendrimer polymers include Polyamido-amine Dendrimers (PAMAM) and Polypropylene-imine Dendrimers (PPI) and PAMAM-OS which is a dendrimer with a PAMAM interior structure and organo-silicon exterior. The former two are available from Aldrich Chemical™ and the last one from Dow-Corning™.

Similar requirements exist for inorganic-organic dendrimers which may be reacted together or with matrix polymers or reactive resins to form a single material. In this case the surface of the dendrimer could contain reactive groups similar to those specified above which will either allow dendrimer-dendrimer, dendrimer-organic, dendrimer-hybrid, and dendrimer-HTC matrix reactions to occur. In this case the dendrimer will have an inorganic core and an organic shell, or vice-versa containing either organic or inorganic reactive groups or ligands of interest. It is therefore also possible to have an organic core with an inorganic shell which also contains reactive groups such as hydroxyl, silanol, vinyl-silane, epoxy-silane and other groupings which can participate in inorganic reactions similar to those involved in common sol-gel chemistries.

In all cases phonon transport is enhanced and phonon scattering reduced by ensuring the length scales of the structural elements are shorter than or commensurate with the phonon distribution responsible for thermal transport. Larger HTC particulate materials can actually increase phonon transport in their own right, however, smaller HTC materials can alter the nature of the resin matrix, thereby affect a change on the phonon scattering. This may be further assisted by using nano-particles whose matrices are known to exhibit high thermal conductivity and to ensure that the particle size and interface characteristics are sufficient to sustain this effect and also to satisfy the length scale requirements for reduced phonon scattering. It is also necessary to consider the choice of structures that are more highly ordered including reacted dendrimer lattices having both short and longer range periodicity and ladder or ordered network structures that may be formed from matrices such as liquid crystal epoxy resins and polybutadienes. A resin matrix of the prior art will have a maximum thermal conductivity of about 0.15 W/mK. The present invention provides resins with a thermal conductivity of 0.5 to 5 W/mK and even greater.

Continuous organic-inorganic hybrids may be formed by incorporating inorganic nano-particles in linear or crosslinked polymers and thermosetting resins in which nano-particles dimensions are of the order of or less than the polymer or network segmental length (typically 1 to 50 nm). This would include, but is not exclusive to three routes or mechanisms by which this can occur (i) side chain grafting, (ii) inclusive grafting e.g. between two polymer chain ends, (iii) cross-link grafting involving at least two and typically several polymer molecules. These inorganic nano-particles will contain reactive surfaces to form intimate covalently bonded hybrid organic-inorganic homogeneous materials. These nano-particles may be metal oxides, metal nitrides, and metal carbides, as well as some non-metal oxides, nitrides and carbides. For example, alumina, magnesium oxide and zinc oxide and other metal oxides, boron nitride and aluminum nitride and other metal nitrides, silicon carbide and other carbides, diamond of natural or synthetic origin, and any of the various physical forms of each type and other metal carbides and hybrid stoichiometric and non-stoichiometric mixed oxides, nitrides and carbides. More specific examples of these include $Al_2O_3$, AlN, MgO, ZnO, BeO, BN, $Si_3N_4$, SiC and $SiO_2$ with mixed stoichiometric and non-stoichiometric combinations. Further, these nano-particles will be surface treated to introduce a variety of surface functional groups which are capable of participating in reactions with the host organic polymer or network. It is also possible to coat non-HTC materials, such as silica and other bulk filler materials, with an HTC material. This may be an option when more expensive HTC materials are used.

The volume percentage of the HTC materials in the resin may be up to approximately 60% or more by volume, and more particularly up to approximately 35% by volume. Higher volume filling tends to give higher structural stability to a matrix. However, with control of the size and shape distribution, degree of particle association and alignment the HTC materials can occupy as little as 1% by volume or less. Although, for structural stability reasons, it might be useful to add an amount greater than the minimum needed for percolation to occur. Therefore the resin can withstand physical strains and deformation without damaging the percolation structure and the HTC characteristics.

The addition of surface functional groups may include hydroxyl, carboxylic, amine, epoxide, silane or vinyl groups which will be available for chemical reaction with the host organic polymer or network forming resin system. These functional groups may be naturally present on the surface of inorganic fillers or they may be applied using wet chemical methods, non-equilibrium plasma deposition including plasma polymerization, chemical vapour and physical vapour deposition, sputter ion plating and electron and ion beam evaporation methods. The matrix polymer or reactive resin may be any system which is compatible with the nano-particles and, if required, is able to react with the reactive groups introduced at the nano-particle surface. These may be epoxy, polyimide epoxy, liquid crystal epoxy, cyanate-ester and other low molecular weight polymers and resins with a variety of crosslinking agents.

In the case of non-discrete organic-inorganic hybrids it is possible to use sol-gel chemistry to form a continuous molecular alloy. In this case sol-gel chemistries involving aqueous and non-aqueous reactions may be considered.

The products of the present invention exhibit higher thermal conductivity than conventional electrically insulating materials and may be used as bonding resins in mica-glass tape constructions, as unreacted vacuum-pressure impregnation resins for conventional mica tape constructions and as stand alone materials to fulfill electrical insulation applications in rotating and static electrical power plant and in both high and low voltage electrical and electronic equipment, components and products. Products of the present invention may be combined with each other, as well as HTC-material, and other materials, of the prior art.

Micro and nano HTC particles may be selected on their ability to self aggregate into desired structural, filaments and branched dendrites. Particles may be selected for their ability to self-assemble naturally, though this process may also be modified by external forces such as an electric field, magnetic field, sonics, ultra-sonics, pH control, use of surfactants and other methods to affect a change to the particle surface charge state, including charge distribution, of the particle. In a particular embodiment, particles such as boron nitride, aluminum nitride, diamond are made to self assemble into desired shapes. In this manner, the desired aggregation structures can be made from highly thermally conductive materials at the outset or assembled during incorporation into the host matrix.

In many embodiments, the size and shape of the HTC-materials are varied within the same use. Ranges of size and shape are used in the same product. A variety of long and shorter variable aspect ratio HTC-materials will enhance the thermal conductivity of a resin matrix, as well as potentially provide enhanced physical properties and performance. One aspect that should be observed, however, is that the particle length does not get so long as to cause bridging between layers of substrate/insulation. Also, a variety of shapes and length will improve the percolation stability of the HTC-materials by providing a more uniform volume filing and packing density, resulting in a more homogeneous matrix. When mixing size and shapes, in one embodiment the longer particles are more rod-shaped, while the smaller particles are more spheroidal, platelet or discoid and even cuboids. For example a resin containing HTC-materials could contain about 55-65% by volume 10-50 nm diameter spheroids and about 15-25% by volume 10-50 µm length rods, with 10-30% volume resin.

In another embodiment the present invention provides for new electrical insulation materials based on organic-inorganic composites. The thermal conductivity is optimized without detrimentally affecting other insulation properties such as dielectric properties (permittivity and dielectric loss), electrical conductivity, electric strength and voltage endurance, thermal stability, tensile modulus, flexural modulus, impact strength and thermal endurance in addition to other factors such as viscoelastic characteristics and coefficient of thermal expansion, and overall insulation. Organic and inorganic phases are constructed and are selected to achieve an appropriate balance of properties and performance.

In one embodiment the surface coating of nano, meso and micro inorganic fillers having the desired shape and size distribution and the selected surface characteristics and bulk filler properties are complimentary to each other. This enables the percolation structure of the filler phase in the organic host and the interconnection properties to be controlled independently while maintaining required bulk properties. In addition organic and inorganic coatings, as singular or secondary coatings may be used to ensure compatibilisation of the particle surfaces with the organic matrix and allow chemical reactions to occur with the host organic matrix.

In regards to shape, the present invention utilizes individual particle shapes tending towards natural rods and platelets for enhanced percolation, with rods being the most preferred embodiment including synthetically processed materials in addition to those naturally formed. A rod is defined as a particle with a mean aspect ratio of approximately 5 or greater, with particular embodiments of 10 or greater, though with more particular embodiments of no greater than 100. In one embodiment, the axial length of the rods is approximately in the range 10 nm to 100 microns. Smaller rods will percolate a resin matrix better, and have less adverse effect on the viscosity of the resin.

Many micro and nano particles form spheroidal and discoid shapes, which have reduced ability to distribute evenly under certain conditions and so may lead to aggregated filamentary structures that reduce the concentration at which percolation occurs. By increasing the percolation, the thermal properties of the resin can be increased, or alternately, the amount of HTC material that needs to be added to the resin can be reduced. Also, the enhanced percolation results in a more even distribution of the HTC materials within the resin rather than agglomeration which is to be avoided, creating a more homogenous product that is less likely to have undesired interfaces, incomplete particle wetting and micro-void formation. Likewise aggregated filamentary or dendritic structures, rather than globular (dense) aggregates or agglomerates, formed from higher aspect ratio particles confer enhanced thermal conductivity.

Additionally, fluid flow fields and electric and magnetic fields can be applied to the HTC materials to distribute and structurally organize them inside of the epoxy resin. By using alternating or static electric fields, the rod and platelet shapes can be aligned on a micro-scale. This creates a material that has different thermal properties in different directions. The creation of an electric field may be accomplished by a variety of techniques known in the art, such as by attaching electrodes across an insulated electrical conductor or by use of a conductor in the centre of a material or the insulation system.

Organic surface coatings, and inorganic surface coatings such as, metal-oxide, -nitride, -carbide and mixed systems may be generated which, when combined with the selected particle size and shape distribution, provide a defined percolation structure with control of the bulk thermal and electrical conductivity of the insulation system while the particle permittivity may be chosen to control the permittivity of the system. Another type of coating is micro-particulate and nano-particulate diamond coatings and of natural or synthetic origin. In poly-crystalline and mono-crystalline nano-particulate form, the particles may associate with the surface of a carrier particle, eg silica. Silica by itself is not a strong thermally conducting material, but with the addition of a surface coating it becomes more of a higher thermal conductivity material. Silica and other such materials, however, have beneficial properties such as being readily formed into rod-shaped particles, as discussed above. In this manner, various HTC properties can be combined into one product. These coatings may also have application to mica tape structures, including both the mica and the glass components, with or without resin impregnation.

Reactive surface functional groups may be formed from surface groups intrinsic to the inorganic coating or may be achieved by applying additional organic coatings both of which may include hydroxyl, carboxylic, amine, epoxide, silane, vinyl and other groups which will be available for chemical reaction with the host organic matrix. These single or multiple surface coatings and the surface functional groups may be applied using wet chemical methods, non-equilibrium plasma methods including plasma polymerization and chemical vapour and physical vapour deposition, sputter ion plating and electron and ion beam evaporation methods.

In another embodiment the present invention provides for new electrical insulation systems based on organic-inorganic composites. The interface between the various inorganic and organic components is made to be chemically and physically intimate to ensure a high degree of physical continuity between the different phases and to provide interfaces which are mechanically strong and not prone to failure during the operation of the electrical insulation system in service in both high and low voltage applications. Such materials have applications in high voltage and low voltage electrical insulation situations where enhanced interfacial integrity would confer advantage in terms of enhanced power rating, higher voltage stressing of the insulation systems, reduced insulation thickness and would achieve high heat transfer.

A particular embodiment uses a variety of surface treatments, nano, meso and micro inorganic fillers, so as to introduce a variety of surface functional groups which are capable of compatibilizing the inorganic surface with respect to the organic matrix or to allow chemical reactions to occur with the host organic matrix. These surface functional groups may include hydroxyl, carboxylic, amine, epoxide, silane or vinyl groups which will be available for chemical reaction with the host organic matrix. These functional groups may be applied using wet chemical methods, non-equilibrium plasma methods, chemical vapour and physical vapour deposition, laser beams, sputter ion plating and electron and ion beam evaporation methods.

In many embodiments, the surface treated materials may be used in bonding resins in mica-glass tape constructions, in unreacted vacuum-pressure impregnation (GVPI & VPI) resins for conventional mica tape constructions and in stand alone electrical insulation coatings or bulk materials to fulfill either electrically insulating or conducting applications in rotating and static electrical power plant and in both high and low voltage electrical equipment, components and products. Also, all chemical reactions should be the result of addition, and not condensation reactions so as to avoid volatile by-products.

Improvements in epoxy resins have recently been made by using liquid crystal polymers. By mixing an epoxy resin with a liquid crystal monomer or by incorporating a liquid crystalline mesogen into an epoxy resin molecule such as DGEBA, a liquid crystal thermoset (LCT) epoxy resin is produced that contains polymers or monomers that can be cross-linked to form ordered networks having significantly improved mechanical properties. See U.S. Pat. No. 5,904,984, which is incorporated herein by reference. A further benefit of LCTs is that they also have improved thermal conductivity over standard epoxy resins, and lower coefficient of thermal expansion (CTE) values as well.

What makes LCT epoxy resins even more appealing is that they are also better able to conduct heat than a standard epoxy resin. U.S. Pat. No. 6,261,481, which is incorporated herein by reference, teaches that LCT epoxy resins can be produced with a thermal conductivity greater than that of conventional epoxy resins. For example, a standard Bisphenol A epoxy is shown to have thermal conductivity values of 0.18 to 0.24 watts per meter degree Kelvin (W/mK) in both the transverse (plane) and thickness direction, By contrast, an LCT epoxy resin is shown to have a thermal conductivity value, when used in practical applications, of no more than 0.4 W/mK in the transverse direction and up to 0.9 W/mK in the thickness direction.

As used in reference to HTC materials being applied to paper, the term substrate refers to the host material that the insulating paper is formed from, while paper matrix refers to the more complete paper component made out of the substrate. These two terms may be used somewhat interchangeable when discussing this embodiment of the present invention. The increase of thermal conductivity should be accomplished without significantly impairing the electrical properties, such as dissipation factor, or the physical properties of the substrate, such as tensile strength and cohesive properties. The physical properties can even be improved in some embodiments, such as with surface coatings. In addition, in some embodiments the electrical resistivity of the host paper matrix can also be enhanced by the addition of HTC materials.

In addition to the standard mica (Muscovite, Phlogopite) that is typically used for electrical insulation there is also Biotite mica as well as several other Mica-like Alumino-Silicate materials such as Kaolinite, Halloysite, Montmorillonite and Chlorite. Montmorillonite has lattices in its structure which can be readily intercalated with HTC materials such as metal cations, organic compounds and monomers and polymers to give high dielectric strength composites.

Insulating papers are just one type of porous media that may be impregnated with the resin of the present invention. Many other materials and components made therefrom, in many industries, some of which are mentioned below, can use different types of porous media to impregnate the resin into. By way of examples there are glass fiber matrix or fabric, and polymer matrix or fabric, where the fabric might typically be cloth, matt, or felt. Circuit boards, which are glass fabric laminate, with planar lamination, will be one product which will benefit from the use of resins of the present invention.

Types of resin impregnation used with stator coils are known as VPI and GVPI. Tape is wrapped around the coil and then impregnated with low viscosity liquid insulation resin by vacuum-pressure impregnation (VPI). That process consists of evacuating a chamber containing the coil in order to remove air and moisture trapped in the mica tape, then introducing the insulation resin under pressure to impregnate the mica tape completely with resin thus eliminating voids, producing resinous insulation in a mica host. A compression of about 20% is particular to the VPI process in some embodiments. After this is completed, the coils are heated to cure the resin. The resin may contain an accelerator or the tape may have one in it. A variation of this, global VPI (GVPI) involves the process where dry insulated coils are wound, and then the whole stator is vacuum pressure impregnated rather than the individual coils. In the GVPI process, the coils are compressed prior to impregnation with the resin since the dry coils are inserted into their final position prior to impregnation. Although various compression methods have been discussed above, it is also possible to use the VPI/GVPI impregnating process for the actual compression stage of the present invention.

In one embodiment the present invention provides for a high thermal conductivity resin that comprises a host resin matrix and a high thermal conductivity filler. The high thermal conductivity filler forms a continuous organic-inorganic composite with the host resin matrix, and the high thermal conductivity fillers are from 1-1000 nm in length and have an aspect ratio of between 3-100, and a more particular aspect ratio of 10-50

In a related embodiment the high thermal conductivity filler is formed from a two phase organic-inorganic composite, which may include polyhedral oligomeric silsesquioxanes, tetraethyl orthosilicate, and tetrabutyl orthotitanate. Reactive surface groups are present on the thermal conductivity filler. In another embodiment the high thermal conductivity filler is formed from organic-inorganic continuous phase materials. In still another embodiment it is formed from discrete organic-dendrimer composites or from discrete organic-inorganic dendrimer composites.

In another embodiment the present invention provides for a continuous organic-inorganic resin that comprises a host resin network and inorganic high thermal conductivity fillers evenly dispersed in the host resin network and essentially completely co-reacted with the host resin network. The high thermal conductivity fillers have a length of between 1-1000 nm and an aspect ratio of 10-50. The high thermal conductivity fillers are selected from at least one of oxides, nitrides, and carbides, and have been surface treated to introduce surface functional groups that allows for the essentially complete co-reactivity with the host resin network. The surface functional groups can be applied by methods such as surface wetting or reactive chemical grafting. Other reactive chemical grafting techniques include non-equilibrium plasma methods, chemical vapor and physical vapor deposition, sputter ion plating, laser beams, electron and ion beam evaporative methods. The continuous organic-inorganic resin comprises a maximum of 60% by volume of the high thermal conductivity fillers, and in a more particular embodiment at least 35% by volume and may contain a cross-linking agent.

In a related embodiment the oxides, nitrides, and carbides comprise $Al_2O_3$, AlN, MgO, ZnO, BeO, BN, $Si_3N_4$, SiC and $SiO_2$ with mixed stoichiometric and non-stoichiometric combinations. Also, the functional groups comprise at least one of hydroxyl, carboxylic, amine, epoxide, silane and vinyl groups. While the host resin network includes epoxy, polyimide epoxy, liquid crystal epoxy and cyanate-ester.

In still another embodiment the present invention provides for a porous media impregnated with a high thermal conductivity resin that comprises a porous media and a high thermal conductivity material loaded resin. The high thermal conductivity material comprises 5-60% by volume of the resin, and is at least one of silica, alumina, magnesium oxide, silicon carbide, boron nitride, aluminum nitride, zinc oxide and diamonds and dendrimers all of approximately 1-1000 nm in size and having aspect ratios of 10-50.

In a related embodiment the high thermal conductivity material comprises 5-40% by volume of the resin. The porous matrix may be paper, such as a mica-glass insulating paper, or other materials such as those used in circuit boards. In another related embodiment the porous media is a natural or synthetic, organic or inorganic polymer fiber that is in the form of a matrixes or fabric. On the macro scale, the porous media may be, for example, a cloth matt or felt.

Figure 4:
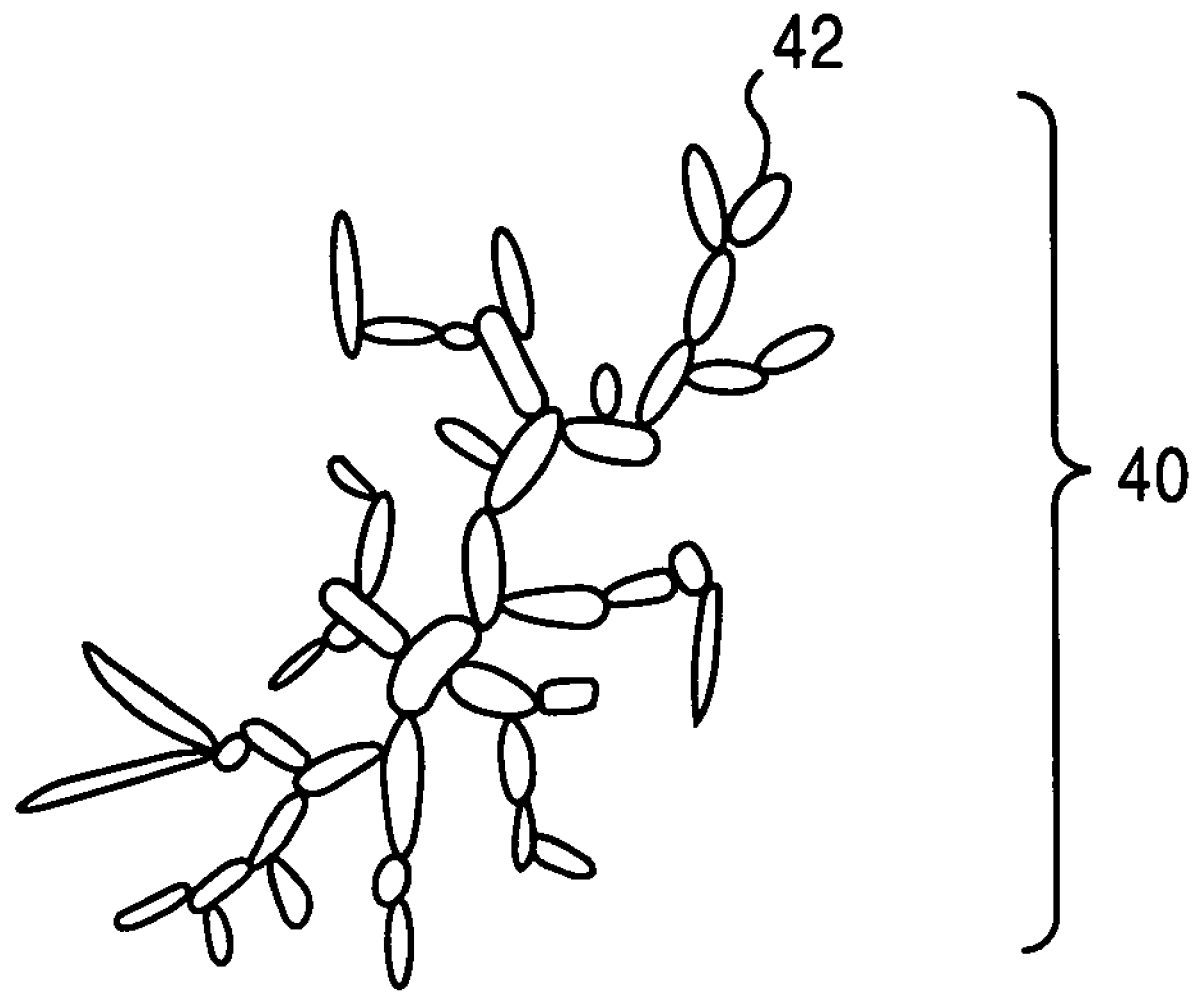
FIG. 4 illustrates one example of a dendritic structure.

HTC dendritic structures make good thermal conductors due to the inherent closeness of neighboring and adjoining HTC particles. FIG. 4 illustrates one example of a dendritic structure 40 that is comprised of many HTC particles 42. It should be noted that a dendrimer, as used herein, is distinct from a dendritic structure. The dendritic filler is essentially an aggregate of particles that form branched structures rather than aggregate clumps. Individually these structures can consist of hundreds and thousands of particles forming many long or extended branched chains, with many interconnections between other dendritic structures within the same resin.

One disadvantage with forming dendritic structures directly in a resin is that while the desired physical properties of the filled resin increase with size of the dendritic structure, so do related undesirable properties such as viscosity. Adhesive properties can also be diminished if viscosity is increased. A host resin with large dendritic structures becomes impracticable for impregnation, and the dendritic structures themselves can even be filtered out of the resin depending on the void or pore size of the porous media being impregnated. By use of the present invention, less viscous resins can be used and dendritic structures can still be formed within the system.

To form the dendritic fillers, surface functionalized or non-functionalized HTC materials interact either with themselves or with one another. Surface functionalizing materials can be done by processes known in the art, which involves grafting at least one functionalized organic group onto the HTC-material. The functionalized group can be a variety of reactive groups, including but not limited to OH, NH, or another carboxylic group. Examples of functionalizing include a silane grafting or a free radical grafting. In a more particular embodiment, the silane grafting involves reactants chosen from 4-trimethoxysilyl tetra-hydrophthalic anhydride (TSPA) and 3-methacryloxpropyl trimethoxy silane (MOTPS). In another particular embodiment, the free radical grafting involves the reactant ceric ammonium nitrate.

The more branched a dendritic structure the better the physical properties of the filled resin that rely on particle connectivity. Therefore having a plurality of particle-particle interactions and functionalized groups per HTC particle leads to filled resins with greater thermal conductivity. The particle-particle interaction can involve the shape of the seed, which can physically lock the building blocks into it.

The dendritic structures are formed within the resin by HTC seeds that pick up HTC building blocks. More seeds bind to already picked up building blocks and the dendritic structure grows thusly. The HTC seeds and building blocks are the HTC materials described herein, but are separated from each other both physically and by the surface functionalized groups. As will be discussed, the two can be combined by a variety of techniques depending on the application of the resin.

To keep the components separated, the attached functional groups are selected to be different in reactivity between the seeds and building blocks. In this manner the seeds could be made to be unreactive with each other on the one hand but be reactive with the building blocks on the other hand, since the seeds and building blocks can be of the same material with sizes and with different functional groups.

The HTC dendritic filler components may be chosen so the HTC seeds and HTC building blocks have minimal co-reactivity with themselves. This minimal co-reactivity does not necessarily mean that the filler components have not co-reacted with themselves prior to attaining a desired size and/or shape as a component. Therefore the components, particularly the building blocks in some embodiment, can be small clusters of individual particles. This can be controlled by having a proportionately small number of intra-reactive functionalized groups. For example, a nanosilica cluster with a necklace structure.

The filler components can be combined in various ways. The seeds are combined with the host resin prior to the resin being used. Example uses include continuous extrusions and impregnations. For continuous extrusions the building blocks are combined with the resins before use. For impregnations the building blocks may be added to the resin, included in the porous media before the resin is added, and combinations of the two. In cases where the building blocks are added to the resins before use the reactions that bonds the components together should be a slow chemical reaction, which means that the reactions should take minutes to hours. The building blocks can be inserted into the porous media ahead of resin impregnation by a carrier liquid medium such as a solvent or resin via vacuum pressure impregnation or by hot laminating techniques such as extrusion, encapsulation or pultrusion. Other techniques for inserting the building blocks into the porous media will be apparent to one of ordinary skill in the art.

When seeded resins are used in impregnation and the building blocks are added to the porous media before impregnation, the seeds in the resin pick up the building blocks and the components are mixed and reacted. This has the double advantage of not beginning the component reactions until the resin is used as well as maintaining low viscosity for the impregnation. As seeds gather building block, which then attract more seeds, clusters are formed. The clusters can then interconnect to form dendritic type networks.

In some embodiments, having the HTC seed particles smaller than the building block materials will aid in the impregnation of resins through reduced viscosity. In such embodiments the range of sizes for the HTC seed particles can be in the range of 1-100 nm. In the embodiments where the building block materials are added to the resin before impregnation, they would be of comparable size. In embodiments where the building blocks are picked up during impregnation, however, they can be substantially larger than the seed particles, having an average size range of 50 to 400 nm.

The ratio of seeds to building blocks (by total volume) can vary depending upon the desired result. For maximum dendritic structure formation, the ratio (by volume) of seeds to building blocks should be slightly higher to encourage more reactions with the building blocks and with each other. Obviously, if the seed particles are smaller than the building blocks this will lead to more total numbers of seed particles, but also to more seed particles by volume if the seed particles and building blocks are of similar densities.

In particular embodiments it is desirable to have maximum dendritic structure formation. This will lead to maximum thermal conductivity in the host resin matrix. Accelerants such as Zinc Naphthenate, Chromium Acetylacetonate, Benzyldimethylamine, Tribenzyltinchloride, Tribenzyltin acetate, and Tetrabutyltitanate can be used to speed up and increase the number of reactions between the components.

In one embodiment the present invention provides for a method of forming HTC dendritic fillers within a host resin matrix that comprises adding HTC seeds to the host resin matrix. The HTC seeds have been surface functionalized to not substantially react with one another. The seeds then accumulate HTC building blocks, and the HTC building blocks have also been surface functionalized to not substantially react with one another. Then assembling the HTC building blocks with the HTC seeds to produce HTC dendritic fillers within the host resin matrix.

In particular embodiments the HTC building blocks react with the HTC seeds, meaning that surface functionalized groups between the two species react with one another. In other embodiments the HTC building blocks interact with the HTC seeds, meaning that there is physical particle-particle interaction.

In other embodiments the HTC building blocks are accumulated by impregnating the host resin with the added HTC seeds into a porous media, and the porous media contains the HTC building blocks. The porous media may be a composite tape, and the porous media may be a natural organic or inorganic polymer fiber matrixes, or a fabric.

In still other embodiments the HTC building blocks are accumulated by mixing the HTC building blocks into the host resin matrix. In related embodiments reacting of the HTC building blocks with the HTC seeds progresses after accumulation as a slow chemical reaction. Also reacting the HTC building blocks progresses with the HTC seeds after addition of an accelerant like zinc naphthenate, chromium acetylacetonate, tribenzyltin chloride, tribenzyltin acetate, and/or tetrabutyltitanate.

In still other related embodiments the HTC seeds have been surface functionalized to have an average of more than one surface functional group. Alternately, the HTC building blocks have been surface functionalized to have an average of more than one surface functional group. The HTC seeds can be selected from the group consisting of silicon oxides, boron nitride, aluminum oxide, magnesium oxide, aluminum nitride, silicon nitride, and the HTC building blocks can be selected from the group consisting of boron nitride, aluminum oxide, and silicon oxide.

In other related embodiments, a percentage of the HTC seeds are grafted to the host resin matrix, and the HTC seeds may be grafted to the host resin matrix prior to the accumulation of the HTC building blocks. The HTC dendritic fillers is 5-40% by volume of the host resin matrix, and the ratio of HTC seeds to HTC building blocks comprising the HTC dendritic fillers is in the range of approximately 2:1 to 1:4 by volume.

In another embodiment, the present invention provides for a method of forming HTC dendritic structures within a resin impregnated porous media that comprises obtaining a host resin and adding HTC seeds to the host resin. The HTC seeds do not substantially react with one another, and a percentage of the HTC seeds are grafted to the host resin. This percentage can vary, but should be at least 5%. Then inserting HTC building blocks to a porous media, where the HTC building blocks do not substantially react with one another. The method also comprises impregnating the host resin into the porous media, where the host resin picks up HTC building blocks from the host media, and reacting and interacting the HTC building blocks with the HTC seeds to produce HTC dendritic fillers within the host resin matrix. Then curing the host resin.

In related embodiments substantially all of the HTC seeds are reacted with the HTC building block. The method may also further comprise mixing additional building blocks directly into the host resin. In other particular embodiments substantially all of the HTC seeds are grafted to the host resin, and the porous media is a composite tape.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

What is claimed is:

1. A method of forming high thermal conductivity (HTC) dendritic fillers within a host resin matrix comprising:
  adding HTC seeds to said host resin matrix, wherein said HTC seeds comprise first fillers that have been surface functionalized with at least one first functional group, and wherein the HTC seeds do not substantially react with one another;
  accumulating HTC building blocks, wherein said HTC building blocks comprise second fillers that have been surface functionalized with at least one second functional group different from the at least one first functional group, and wherein said HTC building blocks do not substantially react with one another; and
  assembling said HTC building blocks with said HTC seeds to produce HTC dendritic fillers having a plurality of branched chains within said host resin matrix;
  wherein the at least one first functional group and the at least one second functional group are effective to separate said HTC seeds and said HTC building blocks within the host resin matrix.

2. The method of claim 1, wherein said HTC building blocks react with said HTC seeds.

3. The method of claim 1, wherein said HTC building blocks interact with said HTC seeds.

4. The method of claim 1, wherein said HTC building blocks are accumulated by impregnating said host resin with said added HTC seeds into a porous media, and wherein said porous media contains said HTC building blocks.

5. The method of claim 4, wherein said porous media is a composite tape.

6. The method of claim 4, wherein said porous media is at least one of a fabric, a natural organic fiber matrix, and an inorganic polymer fiber matrix.

7. The method of claim 1, wherein said HTC building blocks are accumulated by mixing said HTC building blocks into said host resin matrix.

8. The method of claim 7, wherein said assembling comprises reacting said HTC building blocks with said HTC seeds as a chemical reaction.

9. The method of claim 7, wherein said assembling comprises reacting said HTC building blocks with said HTC seeds after adding an accelerant.

10. The method of claim 1, wherein said HTC seeds have been surface functionalized to have an average of more than one surface functional group.

11. The method of claim 1, wherein said HTC building blocks have been surface functionalized to have an average of more than one surface functional group.

12. The method of claim 1, wherein said HTC seeds are selected from the group consisting of silicon oxide, boron nitride, aluminum oxide, magnesium oxide, aluminum nitride, and silicon nitride.

13. The method of claim 1, wherein said HTC building blocks are selected from the group consisting of boron nitride, aluminum oxide, and silicon oxide.

14. The method of claim 1, wherein a percentage of said HTC seeds are grafted to said host resin matrix.

15. The method of claim 14, wherein said HTC seeds are grafted to said host resin matrix prior to the accumulation of said HTC building blocks.

16. The method of claim 1, wherein said HTC dendritic fillers comprise 5-40% by volume of said host resin matrix.

17. The method of claim 1, wherein the ratio of HTC seeds to HTC building blocks comprising said HTC dendritic fillers is approximately 2:1 to 1:4 by volume.

18. A method of forming high thermal conductivity (HTC) dendritic structures within a resin impregnated porous media comprising:
  obtaining a host resin;
  adding HTC seeds to said host resin, wherein said HTC seeds comprise first fillers that have been surface functionalized with at least one first functional group, wherein said HTC seeds do not substantially react with one another, and wherein a percentage of said HTC seeds are grafted to said host resin;

inserting HTC building blocks to a porous media, wherein said HTC building blocks comprise second fillers that have been surface functionalized with at least one second functional group different from the at least one first functional group, and wherein said HTC building blocks do not substantially react with one another;

impregnating said host resin into said porous media, wherein said host resin accumulates HTC building blocks from said porous media;

reacting and interacting said HTC building blocks with said HTC seeds to produce HTC dendritic fillers within said host resin matrix; and curing said host resin.

19. The method of claim 18, wherein substantially all of said HTC seeds are reacted with said HTC building blocks.

20. The method of claim 18, further comprising mixing additional HTC building blocks directly into said host resin.

21. The method of claim 18, wherein substantially all of said HTC seeds are grafted to said host resin.

22. The method of claim 18, wherein said porous media is a composite tape.

23. The method of claim 18, wherein said porous media is at least one of a fabric, a natural organic fiber matrix, and an inorganic polymer fiber matrix.

* * * * *